United States Patent
Kim

[11] Patent Number: 5,888,890
[45] Date of Patent: Mar. 30, 1999

[54] METHOD OF MANUFACTURING FIELD EFFECT TRANSISTOR

[75] Inventor: Kee Chul Kim, Kyungki-do, Rep. of Korea

[73] Assignee: LG Semicon Co., Ltd., Chungcheongbuk-Do, Rep. of Korea

[21] Appl. No.: 960,548

[22] Filed: Oct. 31, 1997

Related U.S. Application Data

[63] Continuation of Ser. No. 513,445, Aug. 10, 1995, abandoned.

[30] Foreign Application Priority Data

Aug. 12, 1994 [KR] Rep. of Korea .................. 19948/1994

[51] Int. Cl.$^6$ .................................................. H01L 21/225
[52] U.S. Cl. ........................... 438/559; 438/563; 438/184
[58] Field of Search ...................................... 438/181, 547, 438/289, 291, 285, 559, 565, 570, 571, 572, 184, 574, 590, 558, 604, 563, 902, 549; 257/641, 631, 649; 148/DIG. 139, DIG. 140, DIG. 144, DIG. 151

[56] References Cited

U.S. PATENT DOCUMENTS

| | | | |
|---|---|---|---|
| 3,907,616 | 9/1975 | Wiemer | 438/181 |
| 4,213,808 | 7/1980 | Thompson et al. | 438/563 |
| 4,344,980 | 8/1982 | Yoder | 438/181 |
| 4,358,891 | 11/1982 | Roesner | 437/912 |
| 4,597,167 | 7/1986 | Moriya et al. | 438/542 |
| 4,694,564 | 9/1987 | Enoki et al. | 437/40 SH |
| 4,700,455 | 10/1987 | Shimada et al. | 438/181 |
| 4,824,798 | 4/1989 | Burnham et al. | 438/508 |
| 4,830,983 | 5/1989 | Thorton | 438/547 |
| 4,859,616 | 8/1989 | Losehand et al. | 438/542 |
| 4,980,313 | 12/1990 | Takahashi | 438/548 |
| 5,023,199 | 6/1991 | Murakami et al. | 438/559 |
| 5,126,281 | 6/1992 | Carey et al. | 438/559 |
| 5,187,111 | 2/1993 | Nogomi et al. | 438/184 |
| 5,188,978 | 2/1993 | deSouza et al. | 438/181 |
| 5,248,635 | 9/1993 | Bouayad et al. | 438/542 |
| 5,275,969 | 1/1994 | Takahashi | 438/563 |
| 5,557,141 | 9/1996 | Harada et al. | 438/631 |

FOREIGN PATENT DOCUMENTS

594339 A(1) 4/1994 European Pat. Off. ............... 437/152

*Primary Examiner*—John F. Niebling
*Assistant Examiner*—S. Mulpuri
*Attorney, Agent, or Firm*—John P. White; Cooper & Dunham LLP

[57] ABSTRACT

A method of manufacturing a field effect transistor according to the present invention is disclosed including the steps of preparing a semiconductor substrate; forming an insulating film for use as high concentration on the semiconductor substrate; forming an insulating film for use as low concentration on the insulating film for use as high concentration; performing a heat treatment on the insulating films to thereby diffuse impurities; forming high concentration regions and low concentration region in the surface of the semiconductor substrate; forming mesa and electrodes on the upper surface and side of the semiconductor substrate; and selectively etching the insulating film for use as low concentration so as to expose a predetermined portion of the upper surface of the semiconductor substrate, to thereby form a gate electrode so as to be in contact with the low concentration region of the predetermined portion.

6 Claims, 3 Drawing Sheets

METHOD OF MANUFACTURING FIELD EFFECT TRANSISTOR

This application is a continuation of U.S. Ser. No. 08/513,445, filed Aug. 10, 1995 now abandoned.

BACKGROUND OF THE INVENTION

The present invention relates to a field effect transistor, and more particularly, to a method of manufacturing a field effect transistor.

In general, a field effect transistor is composed of source and drain electrodes supplied with currents, an active layer formed therebetween and supplied with a current, and a gate electrode controlling the active layer with a voltage to thereby control the current flow.

In a metal semiconductor field effect transistor (MESFET) having such general structure, the characteristics of the current and voltage is determined by the following equations (1) and (2).

$$Id = Zqv(x) \int_{h(x)}^{t} N(y)dy \quad (1)$$

$$V(h(x)) = \frac{q}{\epsilon_s} \int_{0}^{h(x)} N(y)y\,dy \quad (2)$$

where x is the distance from the source electrode;
y is the distance from the surface of the active layer;
Id is the drain current;
z is the gate width;
q is the electron charge quantity;
t is the thickness of an active layer;
v(x) is the movement velocity of the electron at the depth y;
N(y) is the impurity concentration of the electron at the depth y;
h(x) is the depth which is scarce of the electron concentration by the gate voltage within the active layer; and
$\epsilon_s$ is the dielectric constant of the active layer.

At this time, when the gate voltage V(h(x)) is applied, the value of the drain current Id can be obtained by finding the depth h(x) being scarce of the electron concentration from the equation (2) and substituting it for the equation (1).

As the field effect transistor having such current-voltage characteristics, there are a depletion mode field effect transistor (DFET) and an enhancement mode field effect transistor.

Here, the DFET is a device in which the lack of the electron concentration cannot fully isolate the active layer when the voltage of 0V is applied to the gate, so that the drain current flows.

Meantime, the EFET is a device in which the drain current cannot flow because the active layer is fully isolated.

The important difference between these devices is that the depths of the active layers are different from each other.

Particularly, in the EFET, it is difficult to obtain the active layer through the general method of forming the active layer, because the active layer is as thin as 500 Å, approximately.

Accordingly, the general method of forming the active layer will be described with reference to a conventional method.

FIG. 1 is a cross-sectional view showing the structure of a conventional field effect transistor.

Referring to FIG. 1, in the conventional field effect transistor, a buffer layer 2 of mesa shape is formed on a semiconductor substrate 1. Active layers 3, 4 and 5 are formed on buffer layer 2, sequentially.

Further, a gate electrode 7 is formed within a V-groove 6 formed in the center of active layers 3, 4 and 5.

Moreover, a source electrode 8 and a drain electrode 9 are formed on the active layers 4 and 5 of the high concentration region and on the both sides of mesa.

A method of forming the active layer in the conventional field effect transistor structure composed as described above will be explained, as follows.

The active layer is formed hitherto by using the chemical vapor deposition (CVD) method or the ion implantation method.

Here, according to the CVD method, it is relatively easy to manufacture the polymeric compound. Further, the metal organic vapor deposition method facilitating the mass production is used.

Here, the MOCVD method is a deposition method where the organic metal compound of the 3-group atom and the hydrogen compound of the 5-group atom are used as the raw material, using the hydrogen as the carrier gas. That is, the chemical reaction is made while the above raw materials are pyrolyzed on the heated substrate within the reaction chamber, so that an epitaxial layer of the solid state grows.

According to the MOCVD method, it is easy to manufacture the polymeric compound, and it is possible to mass-produce. However, the thickness and concentration of the deposited epitaxial layer is not formed uniformly over the entire of the layer.

Therefore, in case that a digital integrated circuit (IC) is manufactured by using such epitaxial growth method, the threshold voltage which is the important characteristics of the integrated circuit is not uniform. Thus, the entire yield of the circuit manufacture is reduced.

Further, there is a disadvantage that the manufacturing apparatus used for growing the epitaxial layer is expensive.

Meantime, the ion implantation method is a method that an atomic ion is implanted into a target, having so high energy as to penetrate the surface of the target.

According to the ion implantation method, a silicon is used as an n-type, a barium (Be) as a p-type, in the GaAs semiconductor. Further, using the energy of about 30~500 keV, the ion is implanted to the depth of 100~10000 Å below the surface of GaAs, thereby forming the active layer.

At this time, the depth where the ion is implanted is controlled according to the magnitude of the ion energy. Thus, it is possible to select the suitable depth according to the use purpose.

Therefore, the ion implantation method is better than the MOCVD method in the uniformity aspect of the active layer, and have the good characteristics in the mass-production aspect.

However, according to the ion implantation method, it is necessary to precisely control the ion implantation. Further, the unit cost of production is increased because the manufacturing apparatus is expensive.

In addition, in the device used recently, the manufacture of the enhancement mode field effect transistor (EFET) having the thin active layer is required. Thus, there is a problem that the limit of the minimum energy appears during the ion implantation.

Meantime, as another method of forming the active layer, there is a diffusion method.

According to the diffusion method, the impurity can be doped with the thin thickness, as compared with the CVD method or the ion implantation method. Further, the steep of the impurity becomes high, thereby improving the current ratio of Ion/Ioff.

The diffusion method having such characteristics was used hitherto in a silicon, but scarcely used in a compound semiconductor. This is because the compound semiconductor has a low degree of heat tolerance.

Accordingly, in the present invention, an oxide film and a nitride film are used in order to solve the characteristics of the compound semiconductor having a low degree of heat tolerance. Further, a method of improving the characteristics having the steep impurity distribution will be used.

SUMMARY OF THE INVENTION

In order to solve the aforementioned conventional problems, it is an object of the present invention to provide a method of manufacturing a field effect transistor in which an active layer is formed through the diffusion method using an insulating film in order to enhance the steep of the impurity, thereby improving the current characteristics of the transistor.

It is another object of the present invention to provide a method of manufacturing a field effect transistor in which the unit cost of production can be reduced.

To accomplish the objects of the present invention, there is provided a method of manufacturing a field effect transistor comprising the steps of preparing a semiconductor substrate; forming an insulating film having a low concentration region contact hole and used as high concentration on the semiconductor substrate; forming an insulating film for use as low concentration so as to cover the low concentration region contact hole on the insulating film for use as high concentration; performing a heat treatment on the insulating films to thereby form high concentration regions and low concentration regions in the surface of the semiconductor substrate, simultaneously; etching the semiconductor substrate to form a mesa shape; forming electrodes on the upper surface and side of the semiconductor substrate of mesa shape; and etching the insulating film for use as low concentration in order to expose a predetermined portion of the semiconductor substrate, to thereby form a gate electrode so as to be in contact with the low concentration region.

BRIEF DESCRIPTION OF THE ATTACHED DRAWINGS

DETAILED DESCRIPTION OF THE INVENTION

Hereinafter, a field effect transistor according to the present invention will be described with reference to the attached drawings.

Figure 1:
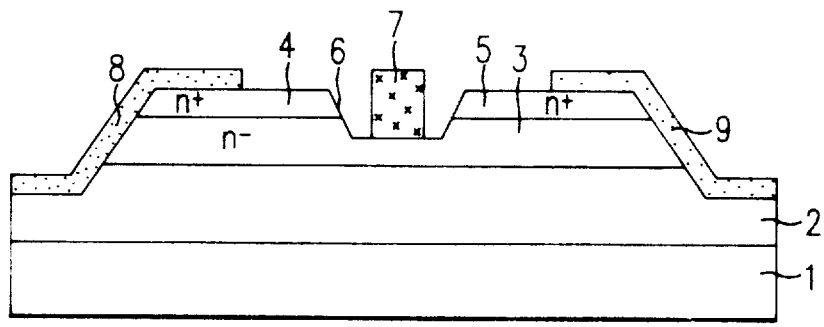
FIG. 1 is a cross-sectional view showing the structure of a conventional field effect transistor.
Figure 2:
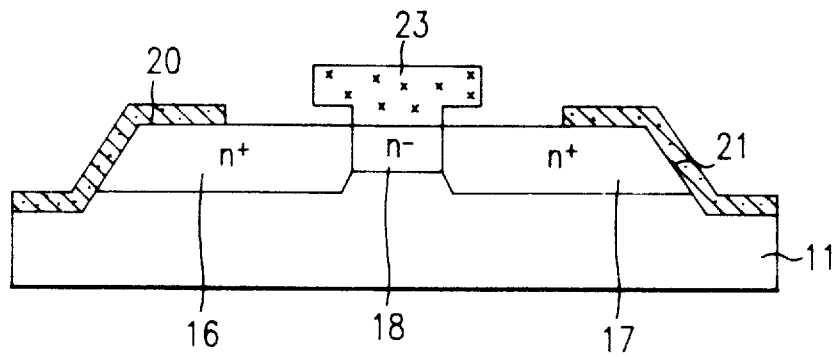
FIG. 2 is a cross-sectional view showing the structure of a field effect transistor according to the present invention.

FIG. 2 is a cross-sectional view showing the structure of a field effect transistor according to the present invention.

Referring to FIG. 2, in a field effect transistor according to the present invention, high concentration regions 16 and 17 are formed in the surface of a semiconductor substrate 11 of mesa shape. Low concentration region 18 is formed in the surface of semiconductor substrate 11 and located between high concentration regions 16 and 17. Impurity electrodes 20 and 21 are formed over the upper surface and side of semiconductor substrate 11 of mesa shape. Gate electrode 23 is formed so as to be in contact with low concentration region 18 on semiconductor substrate 11.

A method of manufacturing the field effect transistor having the aforementioned structure according to the present invention will be described, as follows.

According to a method of manufacturing the field effect transistor of the present invention, an insulating film 12 of the desirable region, which is formed on semiconductor substrate 11 and used as high concentration, is etched. An insulating film 15 for use as low concentration is deposited on the entire surface of insulating film 12 for use as high concentration. A heat treatment is performed on insulating film 12 for use as high concentration and insulating film 15 for use as low concentration. Impurities are diffused into the entire surface of the substrate, thereby forming high concentration regions 16 and 17 and low concentration region 18 in the surface of semiconductor substrate 11. A mesa shape is formed in semiconductor substrate 11, thereby forming an electrical isolation between devices. An electrode of device is formed on the high concentration region. Insulating film 12 for use as high concentration and insulating 15 for use as low concentration are etched selectively, thereby forming gate electrode 23 so as to be in contact with low concentration region 18 on semiconductor substrate 11.

A method of manufacturing the field effect transistor manufactured by the aforementioned process sequence will be explained, in detail, with reference to the attached FIGS. 3A to 3G.

FIGS. 3A to 3G are cross-sectional views for illustrating a method of manufacturing the field effect transistor according to the present invention.

Figure 3A:
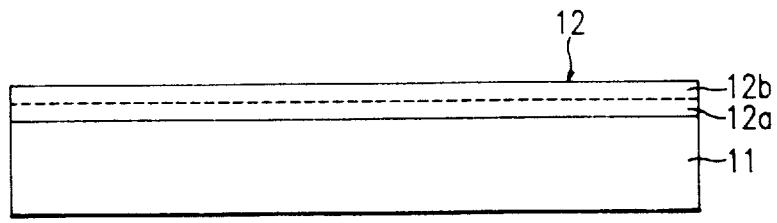
FIGS. 3A to 3G are cross-sectional views for illustrating a method of manufacturing a field effect transistor of FIG. 2 according to the present invention.

To begin with, as shown in FIG. 3A, a semiconductor substrate 11 is prepared. Then, an insulating film 12 for use as high concentration is formed on semiconductor substrate 11.

At this time, in order to improve the ohmic characteristics of electrodes used as source and drain electrodes, insulating film 12 for use as high concentration must have the high impurity concentration. Further, insulating film 12 for use as high silicon-containing concentration is formed with the double structure of an oxide film 12a and a nitride film 12b.

Figure 3B:
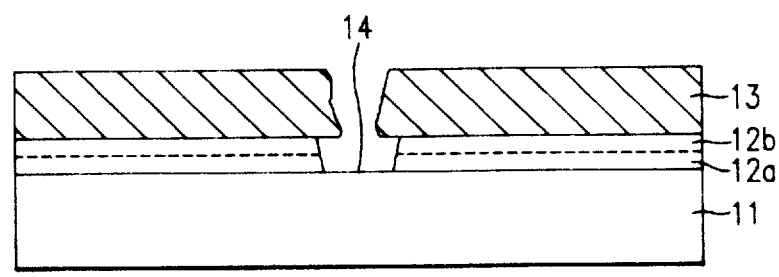

As shown in FIG. 3B, a first photoresist film 13 is coated on insulating film 12 of the double structure for use as high concentration.

Then, after forming a gate region on a predetermined portion of first photoresist film 13, oxide film 12a and nitride film 12b corresponding to the gate electrode portion are etched sequentially through the lithography process. Thus, a low concentration region contact hole 14 is formed.

Figure 3C:
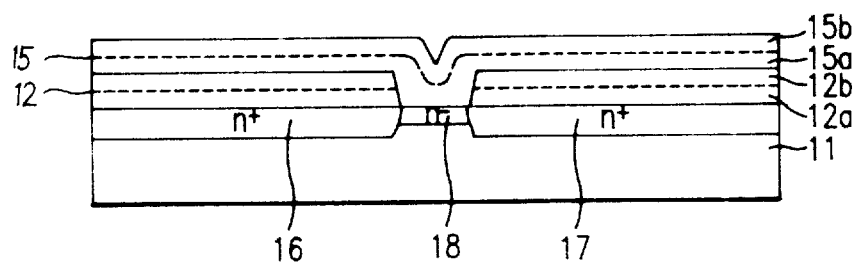

As shown in FIG. 3C, after removing first photoresist film 13, an insulating film 15 for use as low concentration is formed so as to fill low concentration region contact hole 14 on insulating film 12 for use as high concentration.

At this time, insulating film 15 for use as low silicon-containing concentration is formed with the double structure of oxide film 15a and nitride film 15b.

Then, the device is put in the metal heat treatment apparatus, thereby preforming the heat treatment process.

At this time, after performing the heat treatment process on the device under the constant temperature (i.e., in a moment), impurities are diffused into the entire surface of the substrate. Thus, high concentration regions 16 and 17 and low concentration region 18 are formed in the surface of semiconductor substrate 11.

Figure 3D:
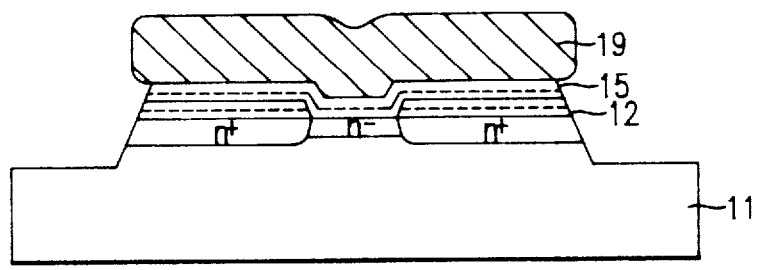

As shown in FIG. 3D, after coating a second photoresist film 19 on the entire surface of the substrate, a mesa shape is patterned by using second photoresist film 19.

Further, in order to isolated the devices from each other, the upper portion of semiconductor 11 is etched with the mesa shape.

Figure 3E:
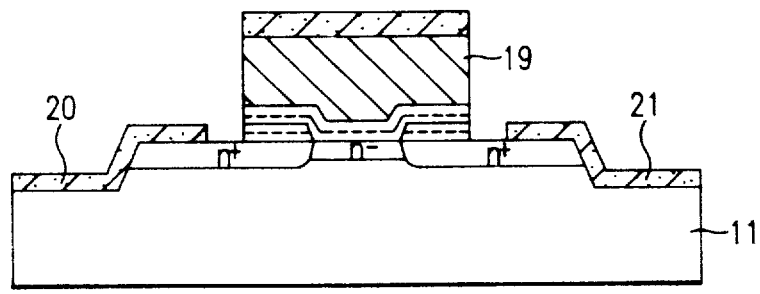

As shown in FIG. 3E, a photoresist film is coated on the entire surface of the substrate and the desirable portion thereof is developed. After depositing a metal layer on the entire surface of the resultant structure, electrodes 20 and 21 serving as source and drain electrodes are formed through the lift-off method.

Figure 3F:
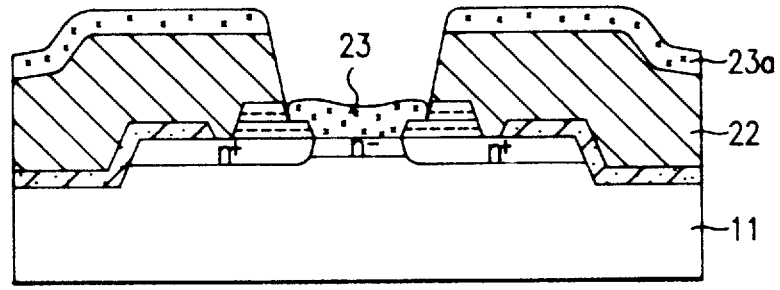

As shown in FIG. 3F, after removing second photoresist film 19, a third photoresist film 22 is formed again on the entire surface of the substrate.

Then, third photoresist film 22 coated on a gate portion is removed so as to expose the surface of insulating film 15 for use as low concentration.

Then, through the selective wet-etching method, the exposed insulating film 15 for use as low concentration is etched so as to expose the surface of semiconductor substrate 11.

Thereafter, on the entire surface of the substrate, a metal layer 23a is deposited so as to cover the surface of the exposed semiconductor substrate 11.

Figure 3G:
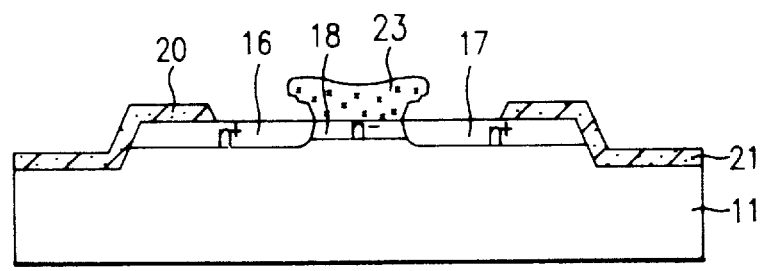

As shown in FIG. 3G, metal layer 23a is removed through the lift-off method, excluding the portion used as the gate electrode. Then, third photoresist film 22 is removed.

Then, insulating film 15 for use as low concentration and insulating film 12 for use as high concentration, which are formed around the metal layer for use as the gate electrode, are etched sequentially, thereby forming gate electrode 23. Thus, the field effect transistor according to the present invention is obtained.

As described above, in the field effect transistor obtained by the manufacturing method according to the present invention, the diffusion method using the oxide film and nitride film is used when forming the active layer. Thus, the manufacturing cost can be reduced.

Further, the active layer obtained by the diffusion method can be formed thinly, as compared with the conventional CVD method or the ion implantation method.

Therefore, the manufacturing method according to the present invention is suitable for manufacturing the EFET having the active layer of thin thickness.

Further, in the manufacturing method according to the present invention, the active layer is formed by using the diffusion method. Thus, the steep of impurity is enhanced, thereby improving the current characteristics of the transistor.

Moreover, in the present invention, when the active layer is formed by using the diffusion method, the unit cost of production can be reduced because the insulating films formed previously are used without using the expensive apparatus.

What is claimed is:

1. A method of manufacturing a field effect transistor comprising the steps of:

preparing a compound semiconductor substrate;

depositing a first oxide film on said compound semiconductor substrate and depositing a nitride film on an entirety of said first oxide film to thereby form an insulating layer as a first silicon-containing, concentration layer, said insulating layer having a contact hole;

depositing a second oxide film on an entire surface of said first concentration layer and on said contact hole simultaneously, and depositing a nitride film on an entirety of said second oxide film to thereby form another insulating layer as a second silicon-containing concentration layer having a lower concentration of impurities than said first concentration layer;

performing a heat treatment on said compound semiconductor substrate to thereby simultaneously form high concentration regions and a low concentration region in a surface of said compound semiconductor substrate;

etching said compound semiconductor substrate to form a mesa shape;

patterning and etching said insulating layers on said compound semiconductor substrate, to form electrodes;

etching a part of said second concentration layer to form a gate electrode on said low concentration region; and removing said insulating layers left around said gate electrode.

2. A method of manufacturing a field effect transistor as claimed in claim 1, further comprising the step of forming said contact hole by etching an exposed portion of said first concentration layer to expose a portion of the surface of said compound semiconductor substrate.

3. A method of manufacturing a field effect transistor as claimed in claim 1, wherein said high concentration regions are formed in an inner part of the surface of said compound semiconductor substrate which is in contact with said first concentration layer.

4. A method of manufacturing a field effect transistor as claimed in claim 1, wherein said low concentration region is formed in an inner part of the surface of said compound semiconductor substrate which is in contact with said second concentration layer.

5. A method of manufacturing a field effect transistor as claimed in claim 1, wherein the process of etching said second concentration layer is made by a sequential and selective wet-etching method.

6. A method of manufacturing a field effect transistor as claimed in claim 1, wherein said gate electrode is formed as T-shape.

* * * * *